United States Patent
Goda et al.

(10) Patent No.: US 7,197,730 B1
(45) Date of Patent: Mar. 27, 2007

(54) REDUCING TIME TO DESIGN INTEGRATED CIRCUITS INCLUDING PERFORMING ELECTRO-MIGRATION CHECK

(75) Inventors: Ananth Somayaji Goda, Bangalore (IN); Kalpesh Amrutlal Shah, Bangalore (IN); Prapanna Tiwari, Bangalore (IN); Sugandhini Karunanidhi, Bangalore (IN); Venugopal Puvvada, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/163,102

(22) Filed: Oct. 5, 2005

(51) Int. Cl.
*G06F 17/50* (2006.01)
(52) U.S. Cl. ............... 716/4; 716/9; 716/12; 716/18
(58) Field of Classification Search ............... 716/1, 716/4, 9, 12, 18
See application file for complete search history.

(56) References Cited

U.S. PATENT DOCUMENTS 6,651,198 B1 * 11/2003 Wang ................. 714/726

* cited by examiner

*Primary Examiner*—Thuan Do
(74) *Attorney, Agent, or Firm*—Alan K. Stewart; W. James Brady; Frederick J. Telecky, Jr.

(57) ABSTRACT

The load limit on each path to avoid EM is estimated and provided as an input to various early design stages (such as placement and routing). Each (of one or more) of the early stages may ensure that the load limit is not violated. Techniques such as increasing the path width and inserting additional circuit (e.g., a buffer cell) in the path, may be employed to avoid the EM violations. As a result, unneeded iterations of design stages may be avoided for purposes of EM checks alone.

15 Claims, 3 Drawing Sheets

REDUCING TIME TO DESIGN INTEGRATED CIRCUITS INCLUDING PERFORMING ELECTRO-MIGRATION CHECK

BACKGROUND OF THE INVENTION

1. Field of the Invention

The present invention relates to computer aided design (CAD) of integrated circuits, and more specifically to a method and apparatus for reducing the time to design an integrated circuit (IC) including performing electro-migration check.

2. Related Art

Integrated circuits are generally designed in multiple stages. For example, a high level design (e.g., in VHDL or Verilog languages, well known in the relevant arts) of an integrated circuit (IC) is synthesized (in a logic synthesis stage) to generate corresponding netlists (containing cells, interconnection details and power supply information). The cells are then placed in a placement stage.

The connections may then be performed first in a global routing stage (in which connections are established ignoring overlap type details) and then a detailed routing stage (in which the connections are routed through various metal layers to avoid overlap as well as to meet other design constraints). All these stages are often performed using corresponding design tools, potentially provided from different vendors (e.g., Cadence, Synopsis).

One of the tasks in such circuit design is electro-migration (EM) check. EM generally refers to dislodging of ions from a metal wire (connecting nodes in an IC), and is caused by current density (current flow divided by width of the metal) exceeding a corresponding threshold. EM impedes the ability of metal to conduct, in addition to leading to reduced life-time. Accordingly, it is generally desirable to ensure that current density does not exceed a desired threshold at least for a substantial amount of time. The related checks in design of ICs may be referred to as EM check.

In one prior embodiment, the EM checks are performed after the detailed routing stage noted above. One advantage of such an approach is that various details such as width (and other geometrical information) of paths (generally referred to as nets in the relevant arts) and expected current strength on the paths would readily be available after the detailed routing stage, and EM check can be easily performed. If a EM violation is detected for a path, the designer is often forced to perform tasks such as increasing the width of the path.

Such an approach may present several disadvantages. For example, increasing the path width can lead to violation of other constraints (e.g., cross-talk noise violation, congestion). Such additional problems may force the designers to revisit at least some of the stages iteratively. For example, a designer may manually attempt to re-route the path. If such re-routing cannot be performed, the designer may need to revisit the earlier design stages (e.g., placement). Such iterative approaches lead to increased design cycle time and costs, and is therefore undesirable at least in some environments.

What is therefore needed is a method and apparatus for reducing the time to design an integrated circuit (IC) including performing electro-migration check.

BRIEF DESCRIPTION OF THE DRAWINGS

Various features of the present invention are described with reference to the following accompanying drawings, which are briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

An aspect of the present invention computes a load limit on each path of an integrated circuit, which would avoid EM violations based on pre-specified values for parameters such as width for the path, and provides as input the load limits to stages earlier than or equal to detailed routing stage (hereafter "early stages"). Each of such early stages may ensure that the load limit is not violated, thereby avoiding EM violations, as desired. As a result, designers may not need to revisit earlier stages for addressing EM violations. The design cycle time and costs may be reduced as a result.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Computer System

Figure 1:
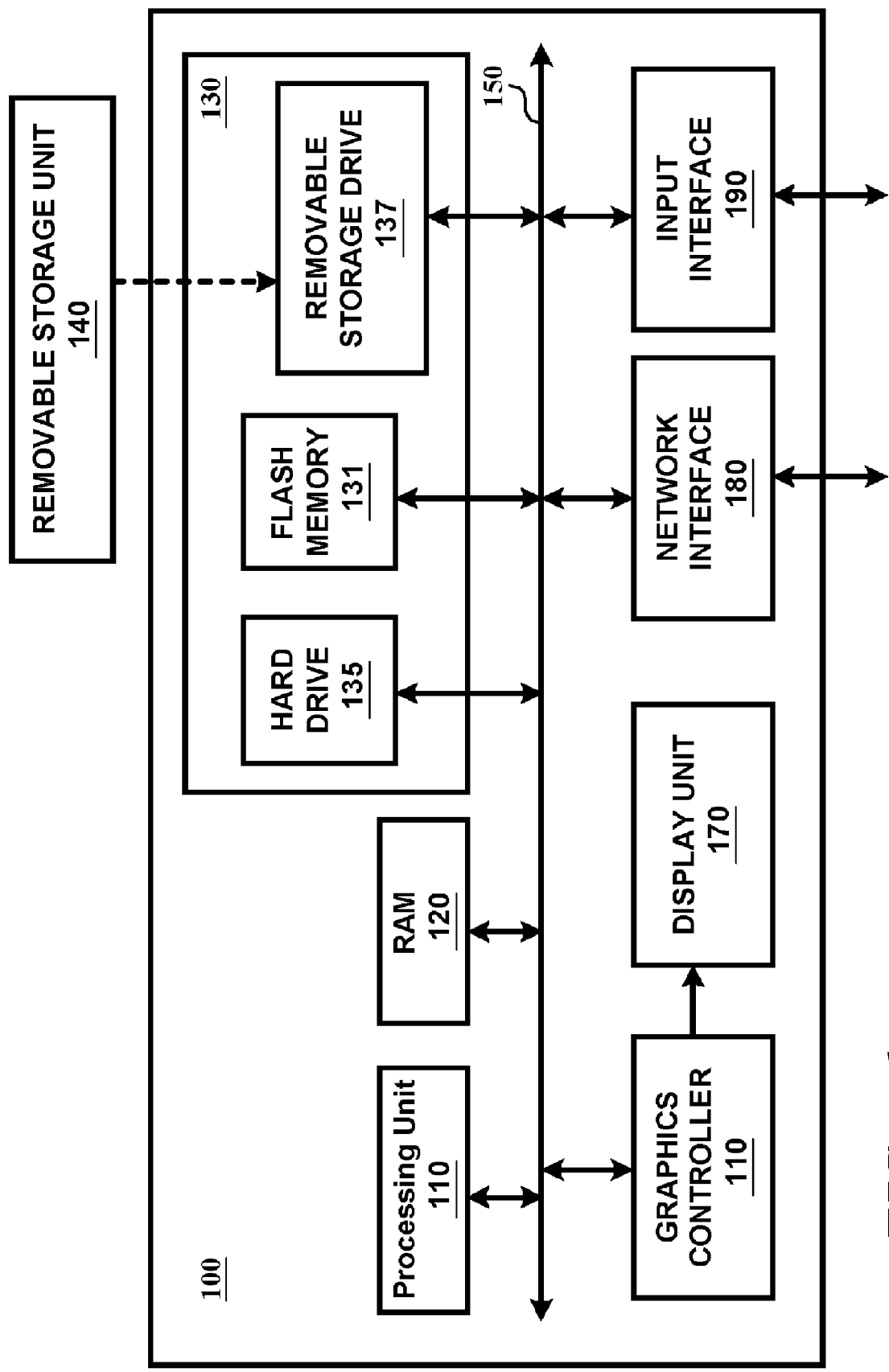
FIG. 1 is a block diagram of an example system in which various aspects of the present invention can be implemented.

FIG. 1 is a block diagram of computer system 100 illustrating an example system in which various aspects of the present invention. The system may be implement a design tool which facilitates design of integrated circuits according to various aspects of the present invention. While the description is provided with respect to a single system merely for illustration, it should be understood that the features can be implemented using several systems, as would typically be the case in the design of complex integrated circuits. Such computer systems are often networked to distribute the various tasks in design of a target integrated circuit.

Computer system 100 may contain one or more processors such as central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described below in further detail.

CPU 110 may execute instructions stored in RAM 120 to provide several features of the present invention (by performing tasks corresponding to various approaches described below). CPU 110 may contain multiple processing units, with each processing unit potentially being designed for a specific task. Alternatively, CPU 110 may contain only a single processing unit. RAM 120 may receive instructions from secondary memory 130 using communication path 150. Data representing the design of an IC, maximum load values (described in sections below), etc., may be stored in and retrieved from secondary memory 130 (and/or RAM 120) during the execution of the instructions.

Graphics controller 160 generates display signals (e.g., in RGB format) to display unit 170 based on data/instructions received from CPU 110. Display unit 170 contains a display screen to display the images defined by the display signals. Input interface 190 may correspond to a key-board and/or mouse, and generally enables a user to provide inputs. Network interface 180 enables some of the inputs (and outputs) to be provided on a network. In general, display unit 170, input interface 190 and network interface 180 enable a user to design integrated circuits according to various aspects of the present invention.

Secondary memory 130 may contain hard drive 131, flash memory 136 and removable storage drive 137. Secondary storage 130 may store the software instructions (which perform the actions described below) and data, which enable computer system 100 to provide several features in accordance with the present invention. Some or all of the data and instructions may be provided on removable storage unit 140, and the data and instructions may be read and provided by removable storage drive 137 to CPU 110. Floppy drive, magnetic tape drive, CD-ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer readable storage medium having stored therein computer software and/or data. An embodiment of the present invention is implemented using software running (that is, executing) in computer system 100.

In this document, the term "computer program product" is used to generally refer to removable storage unit 140 or hard disk installed in hard drive 131. These computer program products are means for providing software to computer system 100. As noted above, CPU 110 may retrieve the software instructions, and execute the instructions to provide various features of the present invention described below. The features of the present invention may be clearer in comparison to a prior approach and accordingly the prior approach is briefly described below.

3. Example Prior Approach

Figure 2:
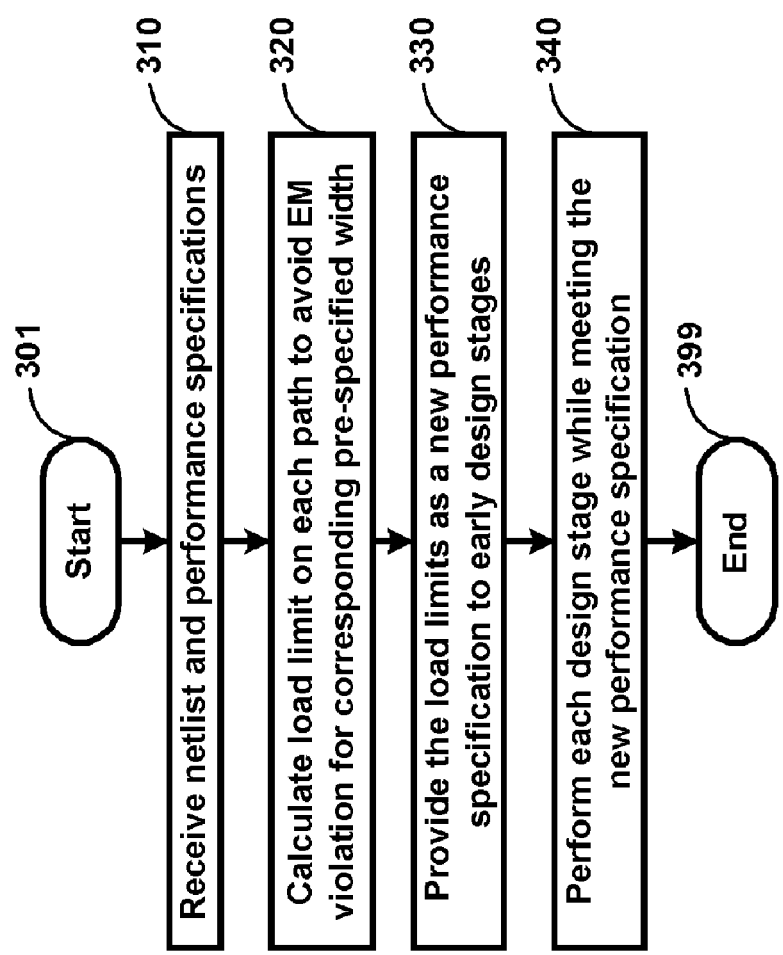
FIG. 2 is a block diagram illustrating the manner in which EM violations are addressed in one prior embodiment.

FIG. 2 is a block diagram illustrating an example prior approach. As shown there, logic synthesis stage 210, placement stage 220, global routing 230, detailed routing 250, verification 260 are performed based on various inputs (e.g., design specifications) received on path 201 from a user.

Logic synthesis stage 210 receives high level design specifications (in form of Verilog language or other VHDL as well known in the relevant art) as input (on path 201) and generates a netlist containing data representing cells, interconnection details, power supply information and constraints information such as slew, voltage, etc. The information may also include load specification for primary outputs (i.e., the external pins). Logic synthesis stage 210 may be implemented using synthesis tools widely available in the market place. The netlist is then provided to placement stage 220.

Various components or cells are placed (physically located in placement stage 220 and connections are performed in global routing 230 and detailed routing 250 considering the constraints information noted above. EM violations may then be checked in verification stage 260. Any EM violations detected are sought to be adjusted either by increasing the width in detailed routing 250 and/or revisiting the earlier stages iteratively as shown by line 265 in FIG. 2. As noted above, in the background section, such an approach is generally undesirable. Various aspects of the present invention overcome at least some of the related disadvantages, as described below in further detail.

4. Inventive Approach

Figure 3:
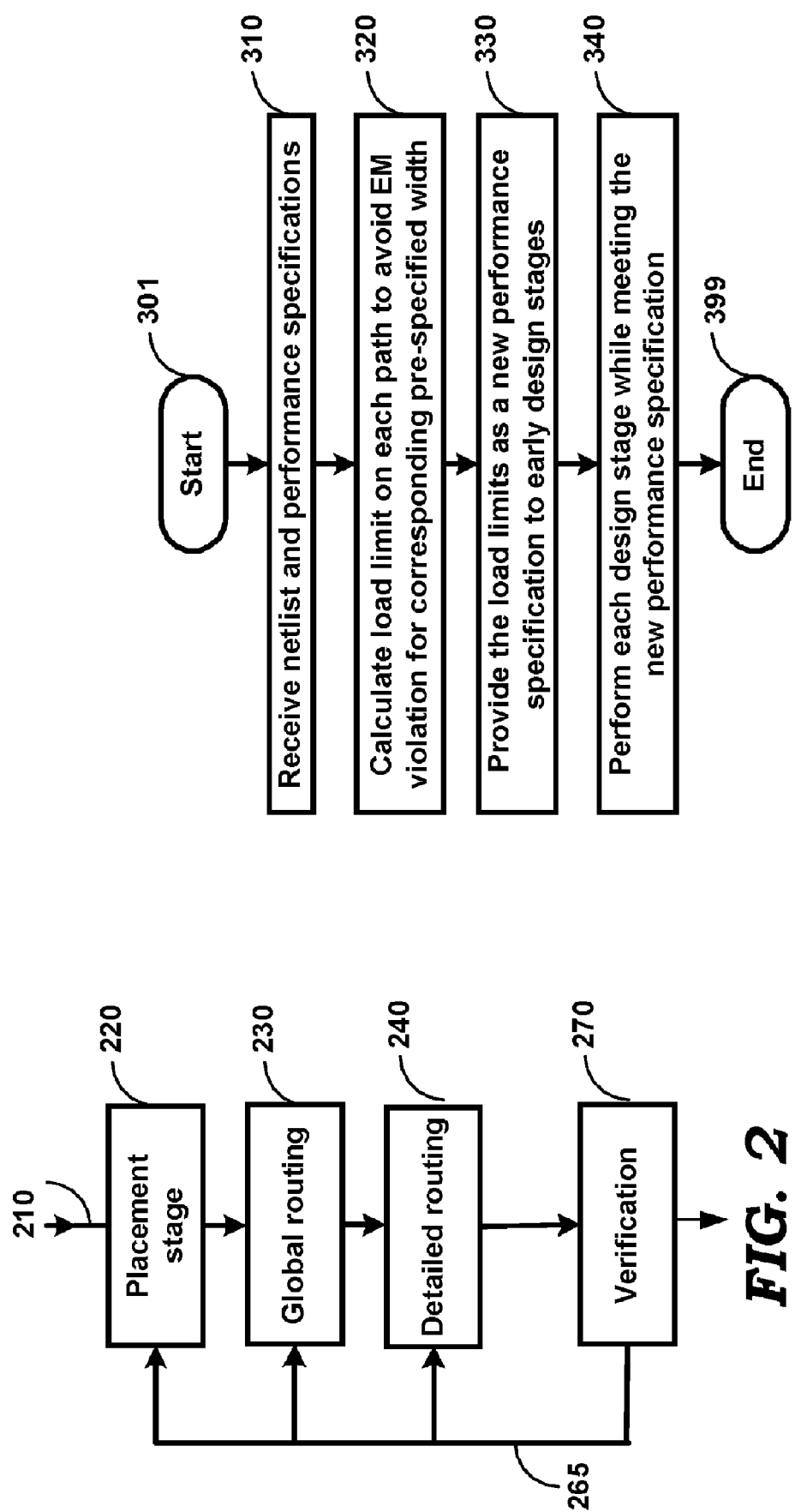
FIG. 3 is a flow-chart illustrating the manner in which EM violations are addressed in an embodiment of the present of the present invention.

FIG. 3 is a flowchart illustrating the manner in which time (and/or cost) to design an integrated circuit (IC) (including performing electro-migration check) may be reduced according to an aspect of the present invention. The flowchart is described with respect to FIG. 1 for illustration. The flowchart begins in step 301, in which control passes to step 310.

In step 310, computer system 100 receives as inputs netlist and performance specifications such as frequency of operation, operating voltage specification, slew rate, etc. for respective portions (or entire) integrated circuit sought to be designed. The inputs may be generated (within or outside of computer system 100) by various synthesis tools, widely available in the marketplace.

In step 330, computer system 100 calculates the load limit on each path to avoid EM violation for a corresponding desired width. In an embodiment, the load limit is computed taking into account other performance specifications such as required slew rate and operating voltage. Various approaches to such calculations will be apparent to one skilled in the relevant arts by reading the disclosure provided herein. An example approach to computation is described in a section below.

In step 350, the load limits are provided as a performance specification (along with other performance specifications) to early design stages, i.e., earlier than or equal to detailed routing stage.

In step 370, computer system 100 performs each early design stage while meeting the performance specification (load limit) provided in step 350. The load limit specification can be met using various approaches, depending on the specific design stage (as described below with reference to FIG. 4). The flowchart ends in step 399.

Due to the meeting of the load limit specification in multiple early stages, the EM violations are avoided as the design progress across stages. The iterations of prior approach of FIG. 2 can be avoided, as described below with reference to an example embodiment described below with reference to FIG. 4.

5. Example Embodiment

Figure 4:
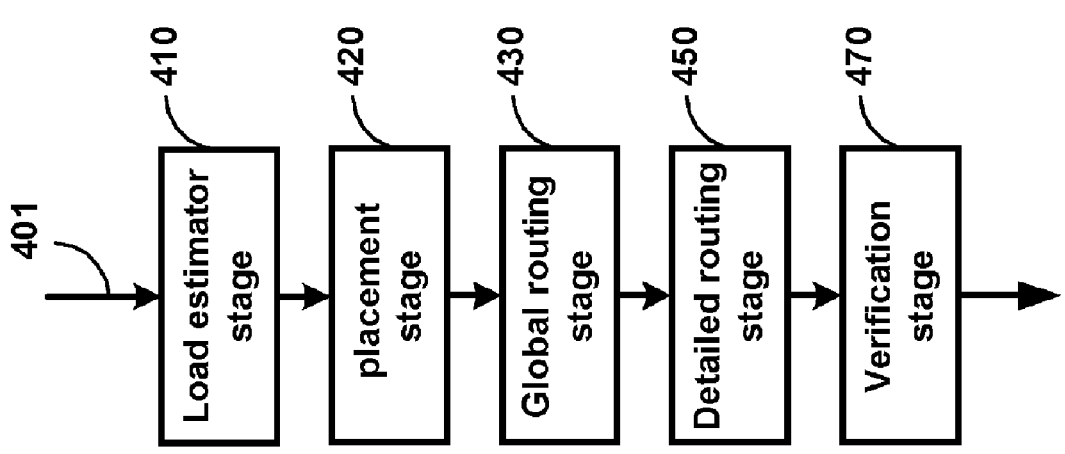
FIG. 4 is a block diagram illustrating the manner in which various early stages can avoid EM violations in an embodiment of the present invention.

FIG. 4 is a block diagram illustrating the details of an embodiment of the present invention. The embodiment is shown containing load estimator stage 410, placement stage 420, global routing stage 430, detailed routing stage 450 and verifications stage 470. For illustration, only the features of the stages as relevant to various aspects of the present invention, are described below for conciseness.

Load estimator stage 410 receives the netlist (e.g., from logic synthesis stage 210, described above) and other constraint specifications on path 401, and estimates the load limit (as also noted above in step 330). The manner in which the load may be estimated is described in a section below.

Placement stage 420 may place the cells taking into account the load limits on respective paths. For example, if the load limit is low for a path, the cells connected by the path may be placed physically closer (compared to paths with higher load limit).

Routing stages 450 and 470 may increase the width (compared to a default specification) if the load limit is being exceeded for a corresponding path. Alternatively, additional circuitry such as a buffer cell may be inserted in the path as demonstrated with reference to FIGS. 5A and 5B.

Figure 5A:
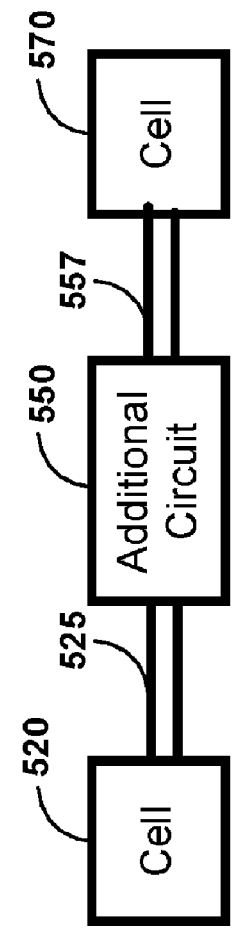
FIGS. 5A and 5B are block diagrams together illustrating an approach to avoiding EM violations in one embodiment.
Figure 5B:
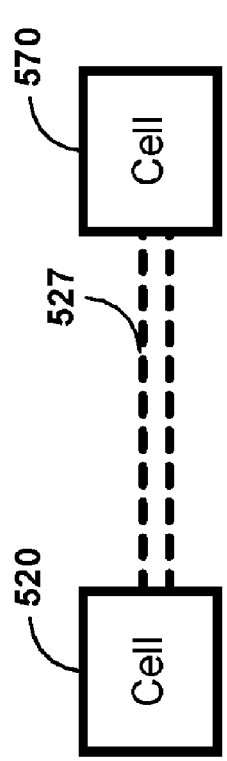

With respect to FIG. 5A, there are shown cells 520 and 570 sought to be connected by path 527 (shown as dotted line). Assuming that path 527 would violate the load specification, additional circuit 550 is inserted in the middle. Path segments 525 and 575 would divide the load on path 527 while providing the desired logical connection as depicted in FIG. 5B.

Additional circuit 550 can be implemented as a buffer, which simply delays signal propagation but provides more strength to the propagated signal. Alternatively or in addition, inverter pairs also may be used, as desirable in specific situations. In general, any components can be provided for additional circuit 550 so long as the design/functional specifications are met (or not altered).

Due to the decreased load, EM violations can easily be avoided on paths 525 and 527. Continuing with combined reference to FIGS. 4 and 5A–5B, it should be appreciated that the technique of FIG. 5B can be implemented even in the placement stage, as suited in the specific environment.

Due to techniques such as those described above, EM violations may not be detected (or substantially reduced compared to the prior approach of FIG. 2) in verification stage 470. Accordingly, the undesired iterations (or perhaps redesigns in individual stages) of FIG. 2 can be avoided.

However, such advantages require estimation of maximum load on at least the paths of interest. The manner in which such estimation may be performed is described below briefly.

6. Load Estimation

EM safety for a metal path is determined by the current density (J) on the corresponding path. The current density on the path are measured in terms of average current density ($J_{avg}$) and rms current density ($J_{rms}$). In order to ensure EM safety the corresponding current densities are limited to a permissible maximum value according to below equations:

$$J_{avg} < J_{avglimit} \quad \text{Equation (1)}$$

$$J_{rms} < J_{rmslimit} \quad \text{Equation (2)}$$

wherein $J_{avglimit}$ and $J_{rmslimit}$ respectively represent the corresponding safe limits.

Since the current density through a path corresponds to current divided by the width of the path (conductive metal interconnect), the current density through a path can be limited by limiting the RMS and Average current flowing through a metal interconnect (path).

Relation between the current density through a interconnect and constraints parameters operating voltage (V), operating frequency (f), recovery factor (rf), capacitive load ($C_{load}$) and slew (s) are given according to the below equations in one embodiment:

$$J_{avg} = ((1-rf)*C_{load}*V*F/W \quad \text{Equation (3)}$$

and $$J_{rms} = (C_{load}*V*sqrt((80*f)/(3*s))/W \quad \text{Equation (4)}$$

The above two equations can be derived (as would be apparent to one skilled in the relevant arts by reading the disclosure provided herein) for driver cell 520 for path 527 by assuming iso-scale triangular waveform at the output of cell 520 for a complete cycle of switching, i.e., current while the load is charging as well as current while the load is discharging with a period 1/f. The width of the triangle is slew at the output pin of 520.

Hence each current limit can be represented as the corresponding capacitive load limits by substituting $J_{avg}$ and $J_{rms}$ with corresponding threshold values from Equations (1) and (2):

$$C_{limit\ avg} = (J_{avglimit}*W)/((1-rf)*V*f) \quad \text{Equation (5)}$$

$$C_{limit\ rms} = ((J_{rmslimit}*W)/((V*sqrt((80*f)/(3*s))) \quad \text{Equation (6)}$$

The corresponding capacitive load limits are provided as specification to the design stages as described above.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of designing an integrated circuit (IC) including performing an electro-migration (EM) check, said method being performed in a computer aided design (CAD) tool, said designing including a plurality of stages including a placement stage, a routing stage and a verification stage in that sequence, said method comprising:

receiving as input a set of cells, a desired connectivity between pairs of said set of cells, wherein said desired connectivity defines a set of paths, with each path connecting a corresponding pair of cells;

receiving in a first stage a set of load limits respectively corresponding to said set of paths as a performance constraint, wherein each load limit indicates a corresponding maximum limit at which EM violation is avoided, wherein said first stage is at a stage prior to said verification stage; and performing design in said first stage while meeting said performance constraint, whereby electro-migration check is performed for said IC in said first stage prior to said verification stage.

2. The method of claim 1, wherein said first stage comprises one of said placement stage, said routing stage and logic synthesis stage.

3. The method of claim 1, wherein said performing comprises:
   determining a load of a first path in said first stage, wherein said first path is contained in said set of paths; and
   placing an additional circuit in said first path if said load determined in said first stage would otherwise exceed said load limit of said first path.

4. The method of claim 3, wherein said additional circuit comprises a buffer circuit.

5. The method of claim 1, wherein said performing comprises:
   determining a load of a first path in said first stage, wherein said first path is contained in said set of paths; and
   increasing a width of said first path if the corresponding load determined in said first stage would otherwise exceed said load limit of said first path.

6. A computer readable medium carrying one or more sequences of instructions facilitating designing of an integrated circuit (IC) including performing an electro-migration (EM) check, said medium being performed in a computer aided design (CAD) tool, said designing including a plurality of stages including a placement stage, a routing stage and a verification stage in that sequence, wherein execution of said one or more sequences of instructions by one or more processors contained in a computer system causes said one or more processors to perform the actions of:
   receiving as input a set of cells, a desired connectivity between pairs of said set of cells, wherein said desired connectivity defines a set of paths, with each path connecting a corresponding pair of cells;
   receiving in a first stage a set of load limits respectively corresponding to said set of paths as a performance constraint, wherein each load limit indicates a corresponding maximum limit at which EM violation is avoided, wherein said first stage is at a stage prior to said verification stage; and
   performing design in said first stage while meeting said performance constraint,
   whereby electro-migration check is performed for said IC in said first stage prior to said verification stage.

7. The computer readable medium of claim 6, wherein said first stage comprises one of said placement stage, said routing stage and logic synthesis stage.

8. The computer readable medium of claim 6, wherein said performing comprises:
   determining a load of a first path in said first stage, wherein said first path is contained in said set of paths; and
   placing an additional circuit in said first path if said load determined in said first stage would otherwise exceed said load limit of said first path.

9. The computer readable medium of claim 8, wherein said additional circuit comprises a buffer circuit.

10. The computer readable medium of claim 6, wherein said performing comprises:
    determining a load of a first path in said first stage, wherein said first path is contained in said set of paths; and
    increasing a width of said first path if the corresponding load determined in said first stage would otherwise exceed said load limit of said first path.

11. A digital processing system enabling the designing of an integrated circuit (IC) including performing an electro-migration (EM) check, said designing including a plurality of stages including a placement stage, a routing stage and a verification stage in that sequence, said system comprising:
    means for receiving as input a set of cells, a desired connectivity between pairs of said set of cells, wherein said desired connectivity defines a set of paths, with each path connecting a corresponding pair of cells;
    means for receiving in a first stage a set of load limits respectively corresponding to said set of paths as a performance constraint, wherein each load limit indicates a corresponding maximum limit at which EM violation is avoided, wherein said first stage is at a stage prior to said verification stage; and
    means for performing design in said first stage while meeting said performance constraint,
    whereby electro-migration check is performed for said IC in said first stage prior to said verification stage.

12. The system of claim 11, wherein said first stage comprises one of said placement stage, said routing stage and logic synthesis stage.

13. The system of claim 11, wherein said performing comprises:
    determining a load of a first path in said first stage, wherein said first path is contained in said set of paths; and
    placing an additional circuit in said first path if said load determined in said first stage would otherwise exceed said load limit of said first path.

14. The system of claim 13, wherein said additional circuit comprises a buffer circuit.

15. The system of claim 11, wherein said performing comprises:
    determining a load of a first path in said first stage, wherein said first path is contained in said set of paths; and
    increasing a width of said first path if the corresponding load determined in said first stage would otherwise exceed said load limit of said first path.

* * * * *